United States Patent
Lu et al.

(10) Patent No.: US 10,601,325 B2
(45) Date of Patent: Mar. 24, 2020

(54) DC-TO-DC CONVERTER CIRCUIT AND CIRCUIT BOARD LAYOUT STRUCTURE FOR THE SAME

(71) Applicant: Delta Electronics, Inc., Taoyuan (TW)

(72) Inventors: Shengli Lu, Taoyuan (TW); Yanbing Xia, Taoyuan (TW); Wenhua Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 25 days.

(21) Appl. No.: 16/001,956

(22) Filed: Jun. 7, 2018

(65) Prior Publication Data

US 2018/0358901 A1   Dec. 13, 2018

(30) Foreign Application Priority Data

Jun. 9, 2017  (CN) .......................... 2017 1 0433641
Nov. 30, 2017  (CN) .......................... 2017 1 1236708

(51) Int. Cl.
| | | |
|---|---|---|
| H02M 3/28 | (2006.01) | |
| H05K 1/18 | (2006.01) | |
| H02M 1/14 | (2006.01) | |
| H02M 3/337 | (2006.01) | |
| H02M 1/44 | (2007.01) | |

(Continued)

(52) U.S. Cl.
CPC .............. H02M 3/28 (2013.01); H02M 1/14 (2013.01); H02M 1/44 (2013.01); H02M 3/3372 (2013.01); H05K 1/181 (2013.01); H02M 2001/0077 (2013.01); H02M 2001/123 (2013.01);

(Continued)

(58) Field of Classification Search
CPC .......... H02M 1/14; H02M 3/28; H02M 3/335; H02M 3/33569; H02M 3/33507; H02M 3/33538; H02M 3/33523; H02M 3/33515; H02M 3/33592; H02M 3/33576; H02M 3/33561; H02M 3/156; H02M 3/33546; H02M 3/3372; H02M 3/337; H02M 3/3378; H02M 3/3376; H05K 1/181
See application file for complete search history.

(56) References Cited

U.S. PATENT DOCUMENTS 9,425,693 B2   8/2016  Wang et al.
9,729,066 B1 *  8/2017  Lu .......................... H02M 1/08
(Continued)

FOREIGN PATENT DOCUMENTS

CN        1780520 A       5/2006
CN      103168408 A       6/2013
(Continued)

*Primary Examiner* — Adolf D Berhane
*Assistant Examiner* — Kevin H Sprenger
(74) *Attorney, Agent, or Firm* — CKC & Partners Co., LLC

(57) ABSTRACT

The present application discloses a DC-to-DC converter circuit and a circuit board layout structure for the same. The DC-to-DC converter circuit is electrically connected between a first power supply side and a second power supply side, and comprises a first branch with a primary side coupled to the first power supply side and a secondary side coupled to the second power supply side; a second branch with a primary side coupled to the first power supply side and a secondary side coupled to the second power supply side; and a first inductor. The secondary sides of the first branch and the second branch are connected in series via the first inductor.

16 Claims, 9 Drawing Sheets

(51) Int. Cl.
  *H05K 1/02* (2006.01)
  *H02M 1/12* (2006.01)
  *H02M 1/00* (2006.01)

(52) U.S. Cl.
  CPC ... *H05K 1/0263* (2013.01); *H05K 2201/1003* (2013.01); *H05K 2201/10053* (2013.01)

(56) References Cited

U.S. PATENT DOCUMENTS

| | | | |
|---|---|---|---|
| 9,887,616 B2* | 2/2018 | Bai | H02M 3/33507 |
| 2005/0180173 A1* | 8/2005 | Batarseh | H02M 3/28 363/15 |
| 2007/0086224 A1* | 4/2007 | Phadke | H02M 3/285 363/65 |
| 2010/0320949 A1* | 12/2010 | Fotherby | H02M 7/48 318/400.26 |
| 2012/0043818 A1* | 2/2012 | Stratakos | H02J 3/383 307/77 |
| 2013/0063185 A1* | 3/2013 | Ye | H02M 3/33569 327/108 |
| 2014/0340940 A1 | 11/2014 | Ouyang et al. | |

FOREIGN PATENT DOCUMENTS

| | | |
|---|---|---|
| CN | 204886704 U | 12/2015 |
| JP | S63283466 A | 11/1988 |
| JP | 2001211645 A | 8/2001 |
| JP | 2017077114 A | 4/2017 |

\* cited by examiner

DC-TO-DC CONVERTER CIRCUIT AND CIRCUIT BOARD LAYOUT STRUCTURE FOR THE SAME

CROSS-REFERENCE TO RELATED APPLICATIONS

This non-provisional application claims priority under 35 U.S.C. § 119(a) on Patent Application No. 201710433641.X filed in P.R. China on Jun. 9, 2017 and Patent Application No. 201711236708.7 filed in P.R. China on Nov. 30, 2017, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

BACKGROUND OF THE INVENTION

1. Field of the Invention

The present application relates to a DC-to-DC converter circuit and a circuit board layout structure for the same.

2. Related Art

DC-to-DC converters are widely used in the fields such as telecommunication, data centers, and supercomputers, due to the outstanding advantages of high power density, high efficiency, and reduced footprint on the system mother board.

However, with the rapid development of fixed networks and mobile communication, the demand for DC-to-DC converters with higher output power and improved efficiency is increasing. Generally, the output power of DC-to-DC converters is increased by connecting switch elements or switch branch in parallel. Referring to FIG. 1, FIG. 1 is a schematic diagram of a DC-to-DC converter circuit in the prior art. As shown in FIG. 1, the DC-to-DC converter circuit in the prior art comprises a first branch 11, a second branch 12, and an output inductor 13. The first branch 11 comprises a first transformer 111, a first primary switching circuit 112, and a first secondary rectifier circuit 113. The second branch 12 comprises a second transformer 121, a second primary switching circuit 122, and a second secondary rectifier circuit 123. The output inductor 13 is connected to a positive output end of the first secondary rectifier circuit 113. Although such a circuit structure may achieve a higher output power, it has some drawbacks in use. Now referring to FIG. 2, FIG. 2 is a waveform diagram of the circuit shown in FIG. 1 when the duty ratio D<25%. As shown in FIG. 2, from a viewpoint of electromagnetic interference (EMI), since the output inductor 13 is displaced in proximity to the positive output end of the DC-to-DC converter circuit, jump frequencies of voltages at connection points A and B is 3 times the switching frequencies of the first primary switching circuit 112 and the second primary switching circuit 122. There are parasitic capacitances at points A and B with respect to primary sides of the transformers 111 and 121 and the ground. Therefore, an increased jump frequency of the voltage may increase radiation interferences and common-mode currents, and deteriorate the electromagnetic interference (EMI) performance. Therefore, it is demanded to develop a DC-to-DC converter circuit for overcoming the above-mentioned drawbacks.

SUMMARY OF THE INVENTION

In order to overcome the above-mentioned problems existing in the prior art, one aspect of the present application is to provide a DC-to-DC converter circuit electrically connected between a first power supply side and a second power supply side, comprising: a first branch with a primary side coupled to the first power supply side and a secondary side coupled to the second power supply side; a second branch with a primary side coupled to the first power supply side and a secondary side coupled to the second power supply side; and a first inductor. The secondary sides of the first branch and the second branch are connected in series via the first inductor.

Another aspect of the present application is to provide a circuit board layout structure circuit board layout structure for a DC-to-DC converter circuit, the DC-to-DC converter circuit electrically connected between a first power supply side and a second power supply side and including a first branch with a primary side coupled to the first power supply side and a secondary side coupled to the second power supply side, a second branch with a primary side coupled to the first power supply side and a secondary side coupled to the second power supply side, and a first inductor, the secondary sides of the first branch and the second branch being connected in series via the first inductor. The circuit board layout structure comprising: a circuit board, having an X-axis direction, and a Y-axis direction perpendicular to the X-axis direction; a transformer unit, disposed on the circuit board; a first switching tube group, disposed on the circuit board, and at one side of the transformer unit in the X-axis direction; a first rectifier tube group, disposed on the circuit board, and at the other side of the transformer unit in the X-axis direction; a second switching tube group, disposed on the circuit board, and at one side of the transformer unit in the X-axis direction; a second rectifier tube group, disposed on the circuit board, and at the other side of the transformer unit in the X-axis direction, and a first inductor, disposed on the circuit board, and between the first rectifier tube group and the second rectifier tube group. The first switching tube group and the second switching tube group are disposed at the same side of the transformer unit in the X-axis direction and arranged along the Y-axis direction, and the first rectifier tube group and the second rectifier tube group are disposed at the same side of the transformer unit in the X-axis direction and arranged along the Y-axis direction.

DETAILED DESCRIPTION OF THE INVENTION

The present application will be further described in detail with reference to the accompanying drawings and embodiments. Those embodiments are implemented according to the technical ideas of the present application. Although specific configuration and processes are described in those embodiments, the protection extent of the present application is not limited thereto.

Note that the values and the expressions "equal to" or "=" in the present application may have an error margin of 5%, or 10%, or even 20%.

A first embodiment of a DC-to-DC converter circuit according to the present application will be described below.

Figure 1:
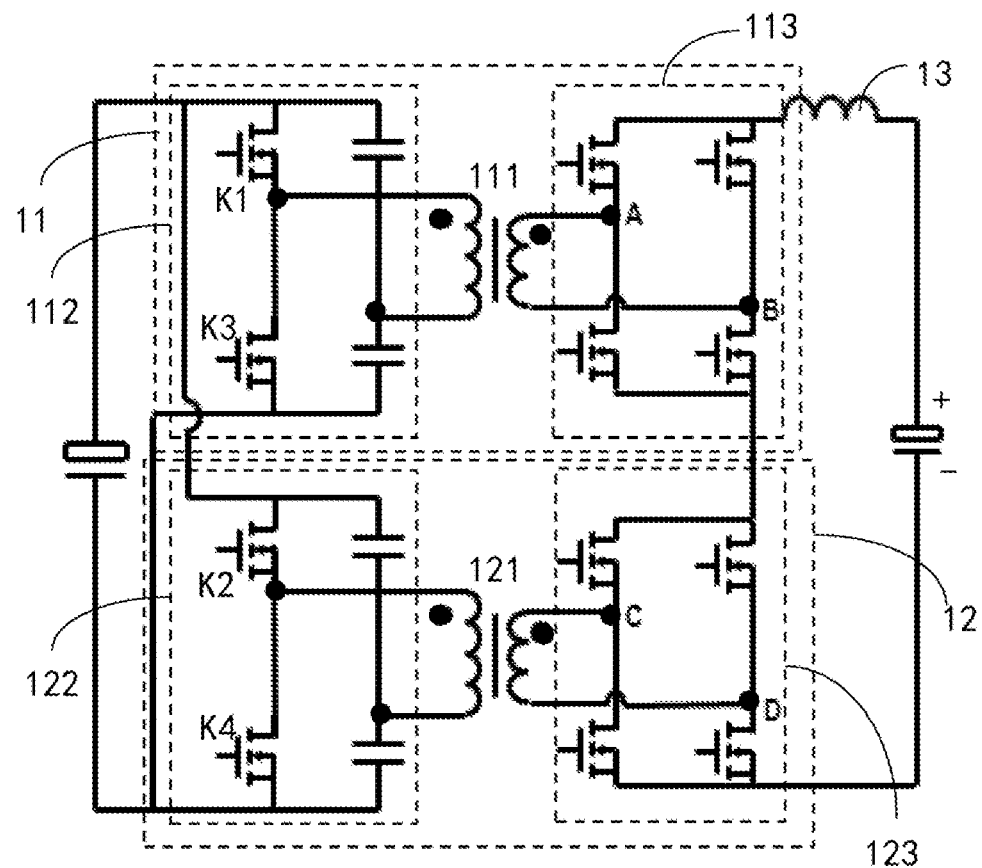
FIG. 1 is a schematic diagram of a DC-to-DC converter circuit in the prior art.
Figure 2:
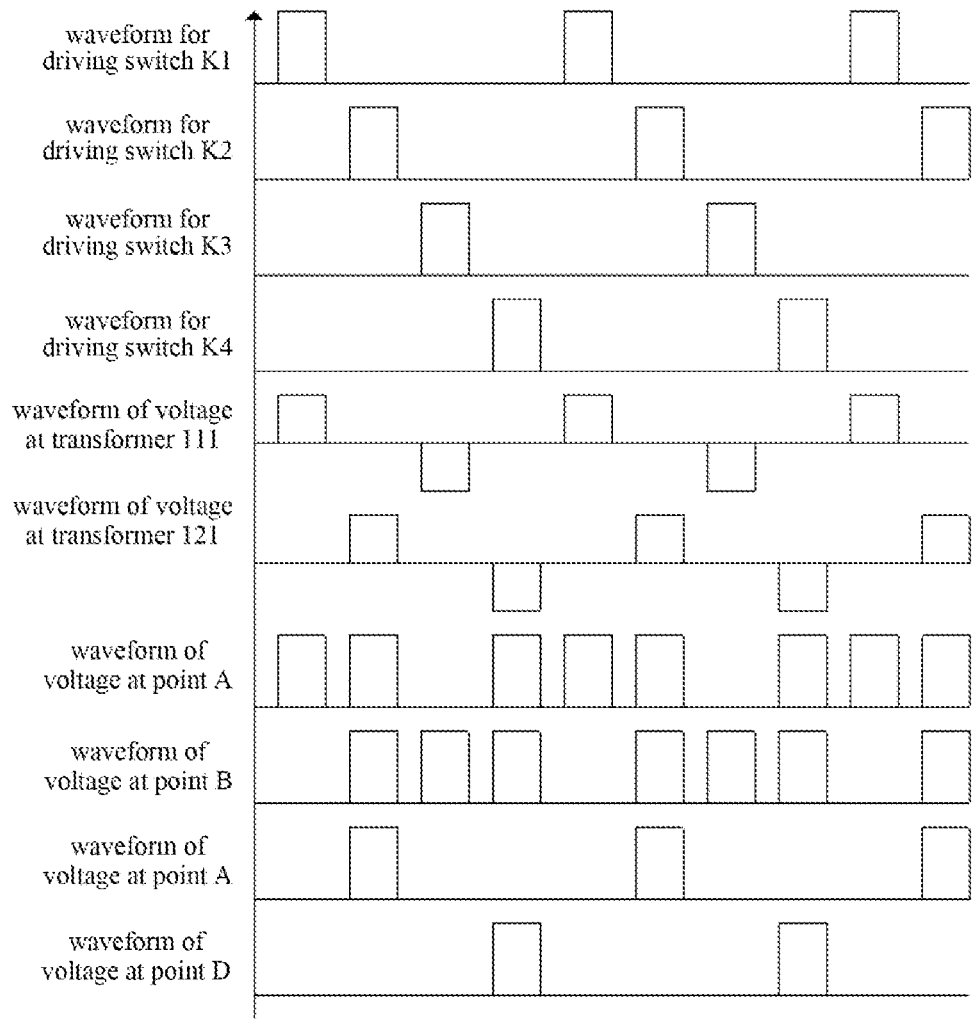
FIG. 2 is a waveform diagram of the circuit in FIG. 1.
Figure 3:
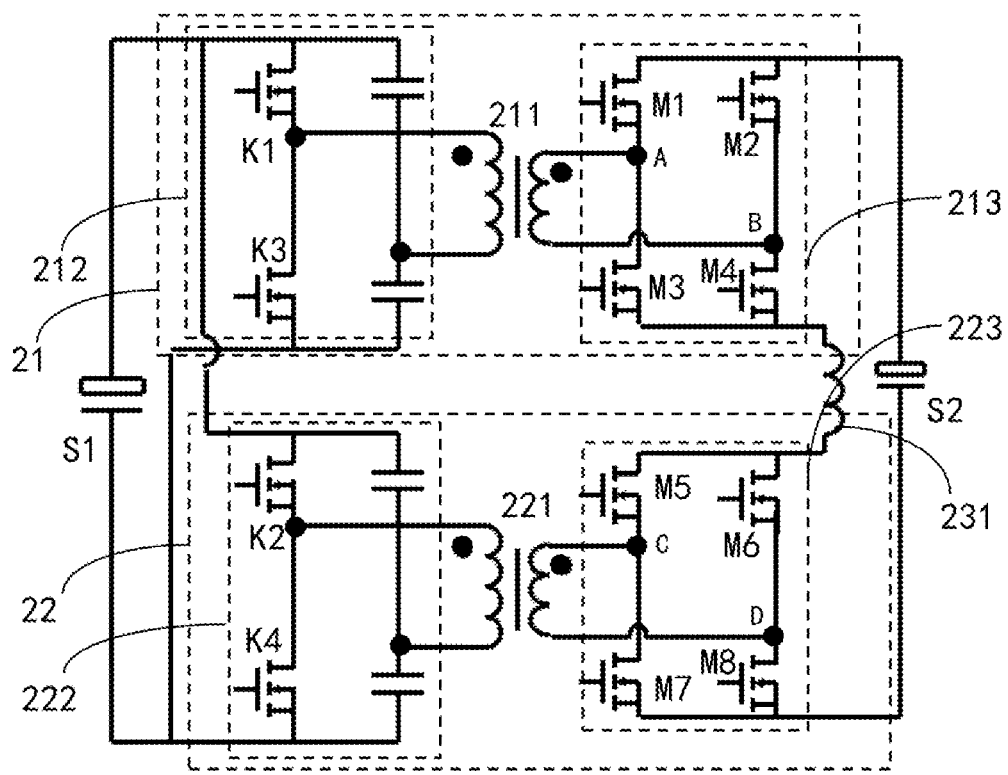
FIG. 3 is a schematic diagram of a first embodiment of the DC-to-DC converter circuit according to the present application.

Referring to FIG. 3, FIG. 3 is a schematic diagram of the first embodiment of the DC-to-DC converter circuit according to the present application. As shown in FIG. 3, the DC-to-DC converter circuit according to the present application is electrically connected between a first power supply side S1 and a second power supply side S2. The converter circuit comprises a first branch 21, a second branch 22, and a first inductor 231. The primary sides of the first branch 21 and the second branch 22 are coupled to the first power supply side S1. The secondary sides of the first branch 21 and the second branch 22 are coupled to the second power supply side S2. The secondary sides of the first branch 21 and the second branch 22 are connected in series via the first inductor 231.

The first branch 21 comprises a first transformer 211, a first primary switching circuit 212, and a first secondary rectifier circuit 213. The first transformer 211 comprises a primary winding and a secondary winding. One end of the first primary switching circuit 212 is electrically connected to the primary winding of the first transformer 211. The other end of the first primary switching circuit 212 is electrically connected to the first power supply side S1. One end of the first secondary rectifier circuit 213 is electrically connected to the secondary winding of the first transformer 211. The other end of the first secondary rectifier circuit 213 is electrically connected to the second power supply side S2 and one end of the first inductor 231.

The second branch 22 comprises a second transformer 221, a second primary switching circuit 222, and a second secondary rectifier circuit 223. The second transformer 221 comprises a primary winding and a secondary winding. One end of the second primary switching circuit 222 is electrically connected to the primary winding of the second transformer 221. The other end of the second primary switching circuit 222 is electrically connected to the first power supply side S1. One end of the second secondary rectifier circuit 223 is electrically connected to the secondary winding of the second transformer 221. The other end of the second secondary rectifier circuit 223 is electrically connected to the second power supply side S2 and the other end of the first inductor 231. That is, the second secondary rectifier circuit 223 and the first secondary side rectifier circuit 213 are connected in series via the first inductor 231. Each of the first branch 21 and the second branch 22 may have a full-bridge topology. However, the present invention is not limited thereto.

In this embodiment, a first connection point A and a second connection point B are formed between the first secondary rectifier circuit 213 and the secondary winding of the first transformer 211, and a third connection point C and a fourth connection point D are formed between the second secondary rectifier circuit 223 and the secondary winding of the second transformer 221. When the converter circuit operates, there is an AC impedance of the first inductor 231 between the first and second connection points A and B and the third and fourth connection points C and D. As a result, the jump voltages at the first connection point A and the second connection point B are no longer superimposed on the jump voltages at the third connection point C and the fourth connection point D. Thus, the jump frequencies of the voltages at the first connection point A and the second connection point B may be reduced.

Figure 4:
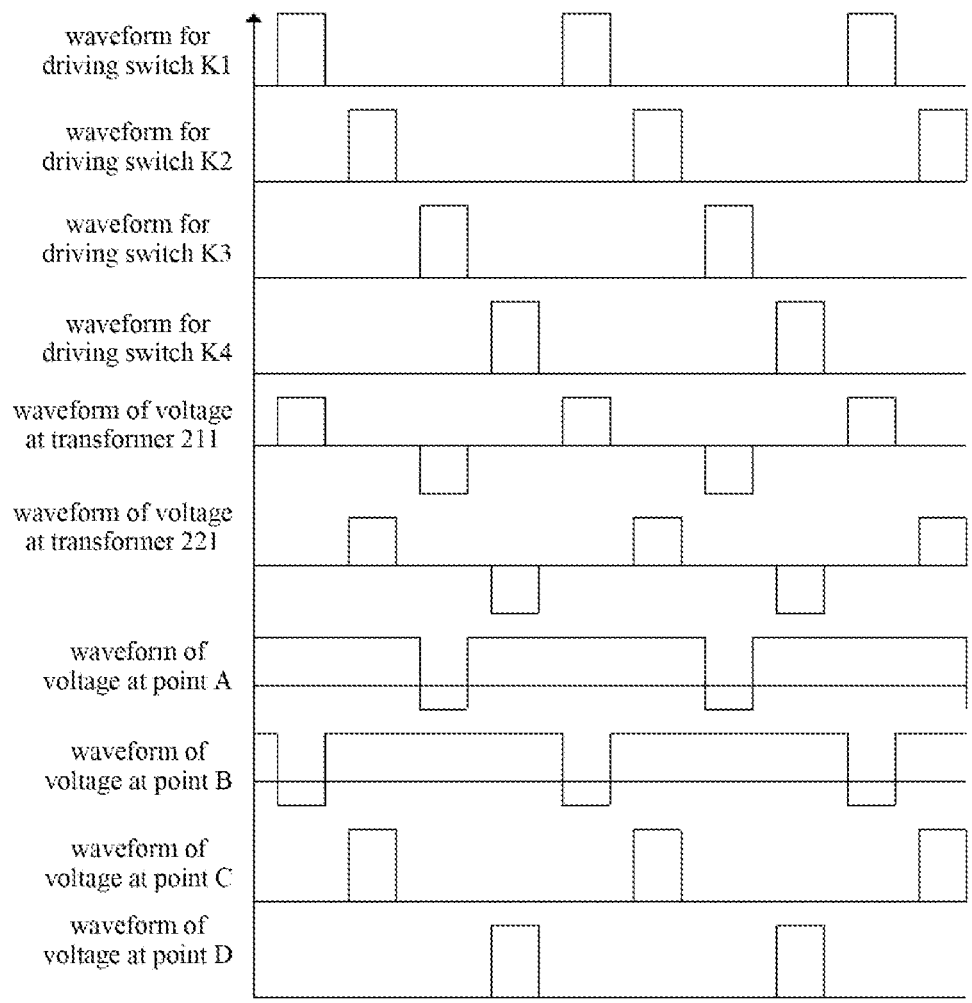
FIG. 4 is a waveform diagram of the circuit in FIG. 3.

Now referring to FIG. 4, FIG. 4 is a waveform diagram of the circuit in FIG. 3. As shown in FIG. 4 and in combination with FIG. 3, with the circuit structure according to the present application, the jump voltages at the first connection point A and the second connection point B are no longer superimposed on the jump voltages at the third connection point C and the fourth connection point D. Accordingly, the jump frequencies of the voltages at the first connection point A and the second connection point B may be reduced. When the converter circuit operates, the jump frequencies of the voltages at the first connection point A and the second connection point B may be 1 time the switching frequencies of the first primary switching circuit 212 and the second primary switching circuit 222. In this way, the present application may decrease the radiation interferences, reduce the common-mode currents, and improve the electromagnetic interference (EMI) performance.

Further, the first primary switching circuit 212 of the first branch 21 comprises two switching tubes K1 and K3. The second primary switching circuit 222 of the second branch 22 comprises two switching tubes K2 and K4. The phase difference Θ between the driving signals for the switching tubes at the same position in the first primary switching circuit branch 212 and the second primary switching circuit branch 222 is Θ=180°/S, where S is the number of the branches. That is, the phase difference Θ between the drive signal for the switching tube K1 and the drive signal for the switching tube K2 is Θ=180°/S. Similarly, the phase difference Θ between the drive signal for the switching tube K3 and the drive signal for the switching tube K4 is Θ=180°/S. In this embodiment, the number of the branches S=2. However, the number of the branches S is not limited thereto in the present application.

Figure 5A:
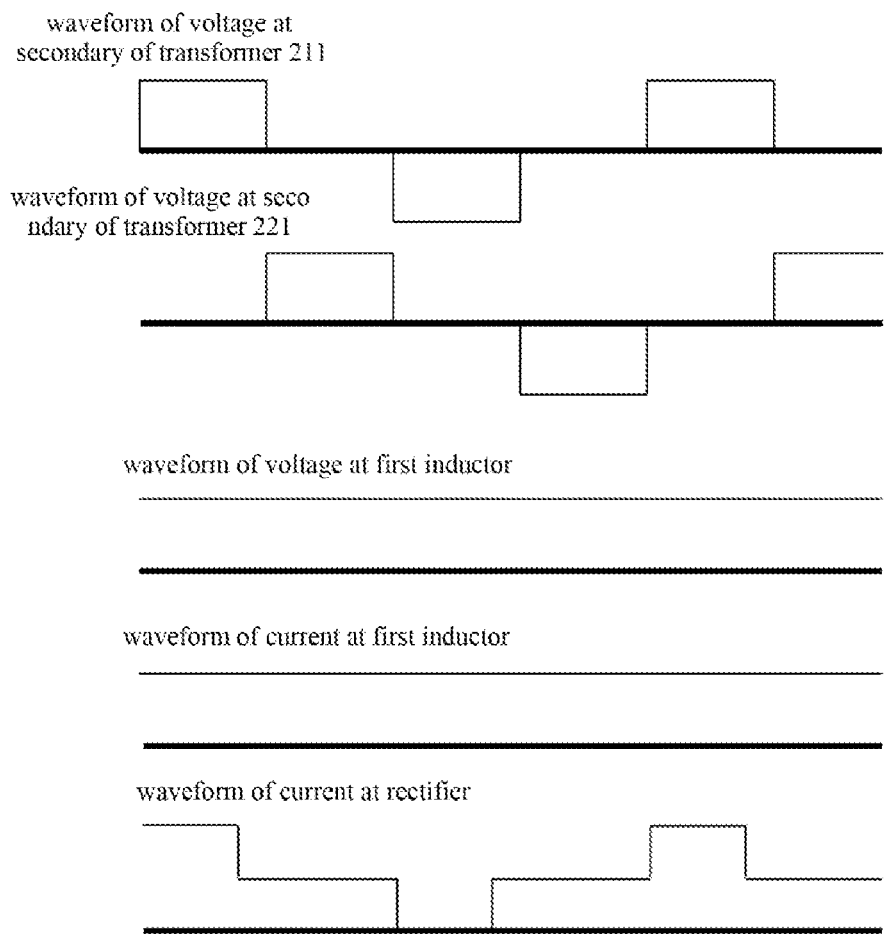
FIG. 5a is a waveform diagram of the secondary circuit in FIG. 3 when the duty ratio is 25%.
Figure 5B:
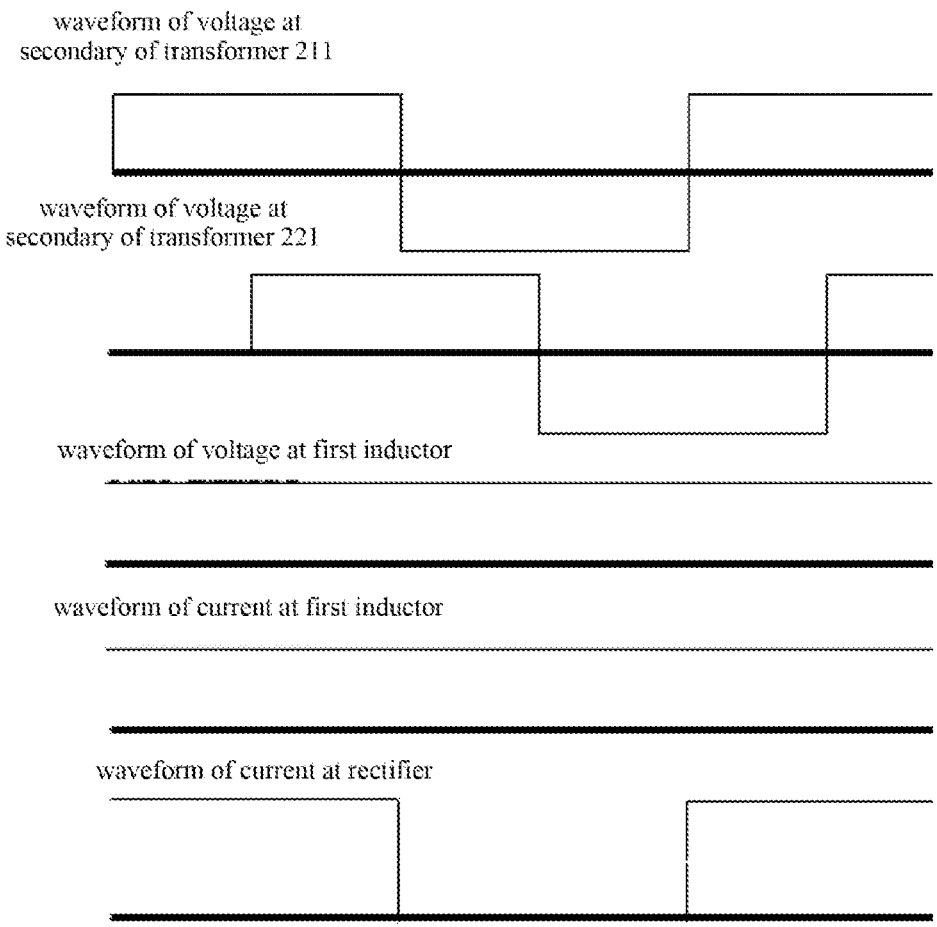
FIG. 5b is a waveform diagram of the secondary circuit in FIG. 3 when the duty ratio is 50%.

Furthermore, referring to FIG. 3 and FIGS. 5a-5b, FIG. 5a is a waveform diagram of the secondary circuit in FIG. 3 when the duty ratio of the first primary switching circuit 212 and the second primary switching circuit 222 is 25%, and FIG. 5b is a waveform diagram of the secondary circuit in FIG. 3 when the duty ratio of the first primary switching circuit 212 and the second primary switching circuit 222 is 50%. When the duty ratio is 25% or 50%, the voltage difference between the voltages at two ends of the first inductor 231 is zero volts, thereby obtaining an output current of zero-ripple. As shown in FIGS. 5a and 5b, when the duty ratio of the first primary switching circuit 212 and the second primary switching circuit 222 in the converter circuit according to the present application is 25% or 50%, the converter circuit may output an output current of zero-ripple at the secondary sides. The output current of zero-ripple has a low RMS (Root Mean Square) value, thereby directly reducing conduction loss of respective elements and copper loss of the transformers. Further, the current of zero-ripple has little high-frequency component and skin effect, thereby reducing the copper loss of respective components within the DC-to-DC converter circuit and greatly reducing the switching-off loss of the switching tubes at the primary side. Of course, the duty ratio of the first primary switching circuit 212 and the second primary switching circuit 222 may alternatively vary within in a range. For example, the duty ratio may be any value in a range of 20% to 30%, or any value in a range of 45% to 50%. Further, when the duty ratio of the first primary switching circuit 212 and the second primary switching circuit 222 is in the range of 20% to 30% or 45% to 50%, the output current is approximately of zero-ripple. Accordingly, the ripple waves of the output current occurring in the control dead time may be filtered by using the stray inductance in wirings and small input/output capacitance. Under this condition, the first inductor 231 may be removed from the designed circuit, so that most of the layout space in the circuit board layout structure of the DC-to-DC converter circuit may be saved and allocated to power switching elements and main transformers, thereby increasing the power density of products directly and greatly.

A second embodiment of a DC-to-DC converter circuit according to the present application will be described below.

Figure 6:
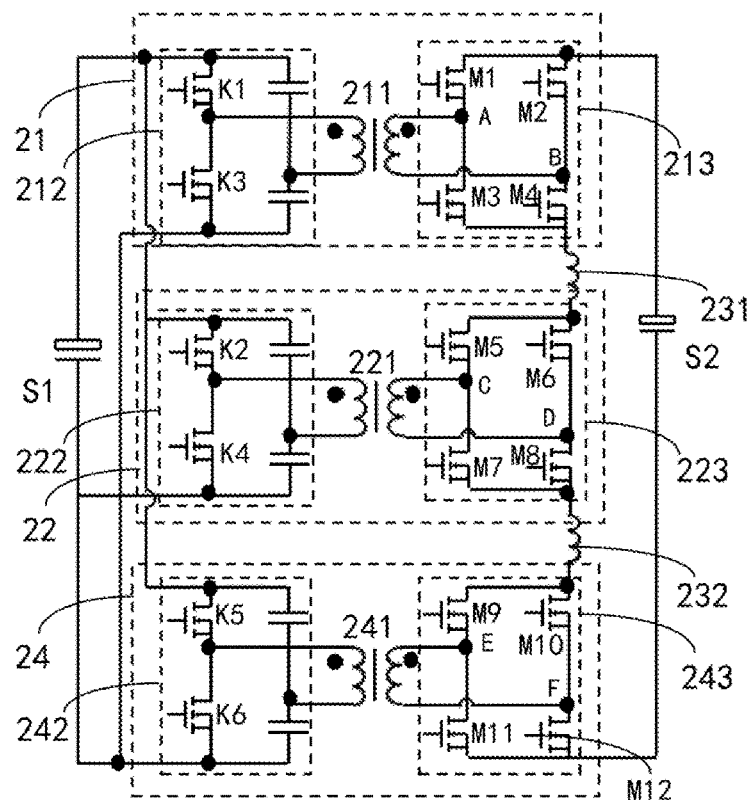
FIG. 6 is a schematic diagram of a second embodiment of the DC-to-DC converter circuit according to the present application.

Referring to FIG. 6, FIG. 6 is a schematic diagram of the second embodiment of the DC-to-DC converter circuit according to the present application. The structure of the converter circuit shown in FIG. 6 is substantially the same as that shown in FIG. 3. Thus, the description for similar elements in FIGS. 6 and 3 will be omitted here. The following description mainly focuses on the difference between them. The converter circuit shown in FIG. 6 further comprises a third branch 24 and a second inductor 232. The primary sides of the first branch 21, the second branch 22, and the third branch 24 are electrically connected, and then coupled to the first power supply side S1. The secondary sides of the first branch 21, the second branch 22, and the third branch 24 are coupled to the second power supply side S2. The secondary sides of the first branch 21 and the second branch 22 are connected in series via the first inductor 231. The secondary sides of the second branch 22 and the third branch 24 are connected in series via the second inductor 232.

The third branch 24 comprises a third transformer 241, a third primary switching circuit 242, and a third secondary rectifier circuit 243. The third transformer 241 comprises a primary winding and a secondary winding. One end of the third primary switching circuit 242 is electrically connected to the primary winding of the third transformer 241. The other end of the third primary switching circuit 242 is electrically connected to the first power supply side S1. One end of the third secondary rectifier circuit 243 is electrically connected to the secondary winding of the third transformer 241. The other end of the third secondary rectifier circuit 243 is electrically connected to the second power supply side S2 and one end of the second inductor 232. The other end of the second inductor 232 is electrically connected to the second secondary rectifier circuit 223. Each of the first branch 21, the second branch 22, and the third branch 23 may have a half-bridge topology. However, the present application is not limited thereto.

In this embodiment, a first connection point A and a second connection point B are formed between the first secondary rectifier circuit 213 and the secondary winding of the first transformer 211, a third connection point C and a fourth connection point D are formed between the second secondary rectifier circuit 223 and the secondary winding of the second transformer 221, and a fifth connection point E and a sixth connection point F are formed between the third secondary rectifier circuit 243 and the secondary winding of the third transformer 241. When the converter circuit operates, there is an AC impedance of the first inductor 231 between the first and second connection points A and B and the third and fourth connection points C and D. As a result, the jump voltages at the first connection point A and the second connection point B are no longer superimposed on the jump voltages at the third connection point C and the fourth connection point D. Thus, the jump frequencies of the voltages at the first connection point A and the second connection point B may be reduced. Further, there is an AC impedance of the second inductor 232 that occurs between the third and fourth connection points C and D and the fifth and sixth connection points E and F. As a result, the jump voltages at the third connection point C and the fourth connection point D are no longer superimposed on the jump voltages at the fifth connection point E and the sixth connection point F. Thus, the jump frequencies of the voltages at the third connection point C and the fourth connection point D may also be reduced. In this way, the present application may decrease the radiation interferences, reduce the common-mode currents, and improve the electromagnetic interference (EMI) performance.

Further, the first primary switching circuit 212 of the first branch 21 comprises two switching tubes K1 and K3, the second primary switching circuit 222 of the second branch 22 comprises two switching tubes K2 and K4, and the third primary switching circuit 242 of the second branch 24 comprises two switching tubes K5 and K6. The phase difference Θ between the driving signals for the switching tubes at the same position in the first primary switching circuit branch 212, the second primary switching circuit branch 222, and the third primary switching circuit 242 is Θ=180°/S, where S is the number of the branches. That is, the phase difference Θ between the driving signals for the switching tube K1, the switching tube K2, and the switching tube K5 is Θ=180°/S. Similarly, the phase difference Θ between the driving signals for the switching tube K3, the switching tube K4, and the switching tube K6 is Θ=180°/S. In this embodiment, the number of the branches S=3. However, the number of the branches S is not limited thereto in the present application.

Further, when the duty ratio of the first primary switching circuit 212, the second primary switching circuit 222, and the third primary switching circuit branch 242 is 25% or 50%, the voltage difference between the voltages at two ends of each of the first inductor 231 and the second inductor 232 is zero volts, thereby obtaining an output current of zero-ripple. When the duty ratio of the first primary switching circuit 212, the second primary switching circuit 222, and the third primary switching circuit branch 242 in the converter circuit according to the present application is 25% or 50%, the converter circuit may output an output current of zero-ripple at the secondary sides. The output current of zero-ripple has a low RMS value, thereby directly reducing conduction loss of respective elements and copper loss of the transformers. Further, the current of zero-ripple has little high-frequency component and skin effect, thereby reducing the copper loss of respective components within the DC-to-DC converter circuit and greatly reducing the switching-off loss of the switching tubes at the primary side. Of course, the duty ratio of the first primary switching circuit 212, the second primary switching circuit 222, and the primary switching circuit 242 may alternatively vary within in a range. For example, the duty ratio may be any value in a range of 20% to 30%, or any value in a range of 45% to 50%. Further, when the duty ratio of the first primary switching circuit 212, the second primary switching circuit 222, and the third primary switching circuit branch 242 is in a range of 20% to 30% or 45% to 50%, the output current is approximately of zero-ripple. Accordingly, the ripple waves of the output current occurring in the control dead time may be filtered by using the stray inductance in wirings and small input/output capacitance. Under this condition, the first inductor 231 and the second inductor 232 may be removed from the designed circuit, so that most of the layout space in the circuit board layout structure of the DC-to-DC converter circuit may be saved and allocated to power switching elements and main transformers, thereby increasing the power density of products directly and greatly.

Alternatively, in another embodiment according to the present application, the converter circuit may further comprise a plurality of third branches 24 and at least one third inductor (not shown). The structure and connection of each of the third branches 24 may be the same as those of the third branch 24 shown in FIG. 6. Every two adjacent third secondary rectifier circuit 243 may be connected in series via the third inductor. The operation principle of the third inductor is the same as that of the second inductor 231 and the second inductor 232. Therefore, detailed description for the operation principle of the third inductor will be omitted here.

Further, when the duty ratio of the first primary switching circuit 212, the second primary switching circuit 222, and the third primary switching circuit branch 242 is 25% or 50%, the voltage difference between the voltages at two ends of each of the first inductor 231, the second inductor 232, and the third inductor is zero volts, thereby obtaining an output current of zero-ripple. When the duty ratio of the first primary switching circuit 212, the second primary switching circuit 222, and the third primary switching circuit branch 242 in the converter circuit according to the present application is 25% or 50%, the converter circuit may output an output current of zero-ripple at the secondary sides. The output current of zero-ripple has a low RMS value, thereby directly reducing conduction loss of respective elements and copper loss of the transformers. Further, the current of zero-ripple has little high-frequency component and skin effect, thereby reducing the copper loss of respective components within the DC-to-DC converter circuit and greatly reducing the switching-off loss of the switching tubes at the primary side. Of course, the duty ratio of the first primary switching circuit 212, the second primary switching circuit 222, and the third primary switching circuit branch 242 may alternatively vary within in a range. For example, the duty ratio may be any value in a range of 20% to 30%, or any value in a range of 45% to 50%. Further, when the duty ratio of the first primary switching circuit 212, the second primary switching circuit 222, and the third primary switching circuit branch 242 is in a range of 20% to 30% or 45% to 50%, an output current of zero-ripple may be achieved in the first inductor 231 and the second inductor 232. Accordingly, the ripple waves of the output current in the control dead time may be filtered by using the stray inductance in the wirings and small input/output capacitance. Under this condition, the first inductor 231, the second inductor 232, and the third inductor may be removed from the designed the circuit, so that most of the layout space in the circuit board layout structure of the DC-to-DC converter circuit may be saved and allocated to power switching elements and main transformers, thereby increasing the power density of products directly and greatly.

Note that the second branch 22, the third branch 24, or at least one fourth branch may be selected to be switched off so as to reduce the no-load loss, and to obtain a wider input/output voltage range in this embodiment.

A third embodiment of a DC-to-DC converter circuit according to the present application will be described below.

Figure 7:
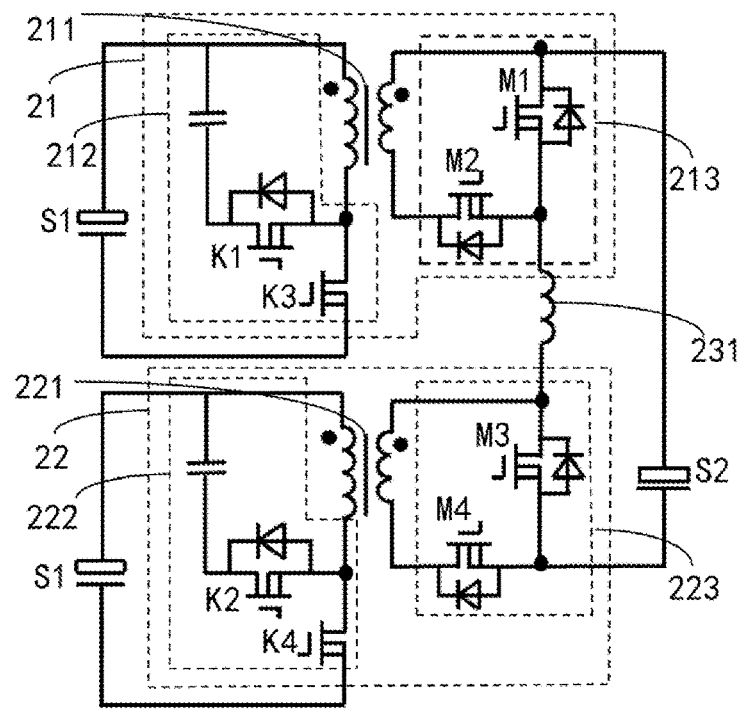
FIG. 7 is a schematic diagram of a third embodiment of the DC-to-DC converter circuit according to the present application.

Referring to FIG. 7, FIG. 7 is a schematic diagram of the third embodiment of the DC-to-DC converter circuit according to the present application. As shown in FIG. 7, each first branch 21 and the second branch 22 may have a forward topology structure, such as an active-clamped forward topology structure. The primary sides of the first branch 21 and the second branch 22 are coupled to the first power supply side S1. The secondary sides of the first branch 21 and the second branch 22 are coupled to the second power supply side S2. The secondary sides of the first branch 21 and the second branch 22 are connected in series via the first inductor 231.

Further, the first primary switching circuit 212 of the first branch 21 comprises two switching tubes K1 and K3. The second primary switching circuit 222 of the second branch 22 comprises two switching tubes K2 and K4. The phase difference Θ between the driving signals for the switching tubes at the same position in the first primary switching circuit branch 212 and the second primary switching circuit branch 222 is Θ=180°/S, where S is the number of the branches. That is, the phase difference Θ between the drive signal for the switching tube K1 and the drive signal for switching tube K2 is Θ=180°/S. Similarly, the phase difference Θ between the drive signal for the switching tube K3 and the drive signal for the switching tube K4 is Θ=180°/S. In this embodiment, the number of the branches S=2. However, the number of the branches S is not limited thereto in the present application.

The operation principle of the converter circuit shown in FIG. 7 is the same as those of the converter circuits in the foregoing embodiments. Therefore, detailed description for the operation principle will be omitted here. Note that the converter circuit shown in FIG. 7 may allow to lower the withstand voltage of the synchronous rectification switches, and to reduce the volume of the output inductance. Particularly, when the duty ratio of the first primary switching circuit 212 and the second primary switching circuit 222 is equal to 50%, the converter circuit may operate in a zero-ripple operating mode, which may greatly increase efficiency and power density of the products.

A fourth embodiment of a DC-to-DC converter circuit according to the present application will be described below.

Figure 8:
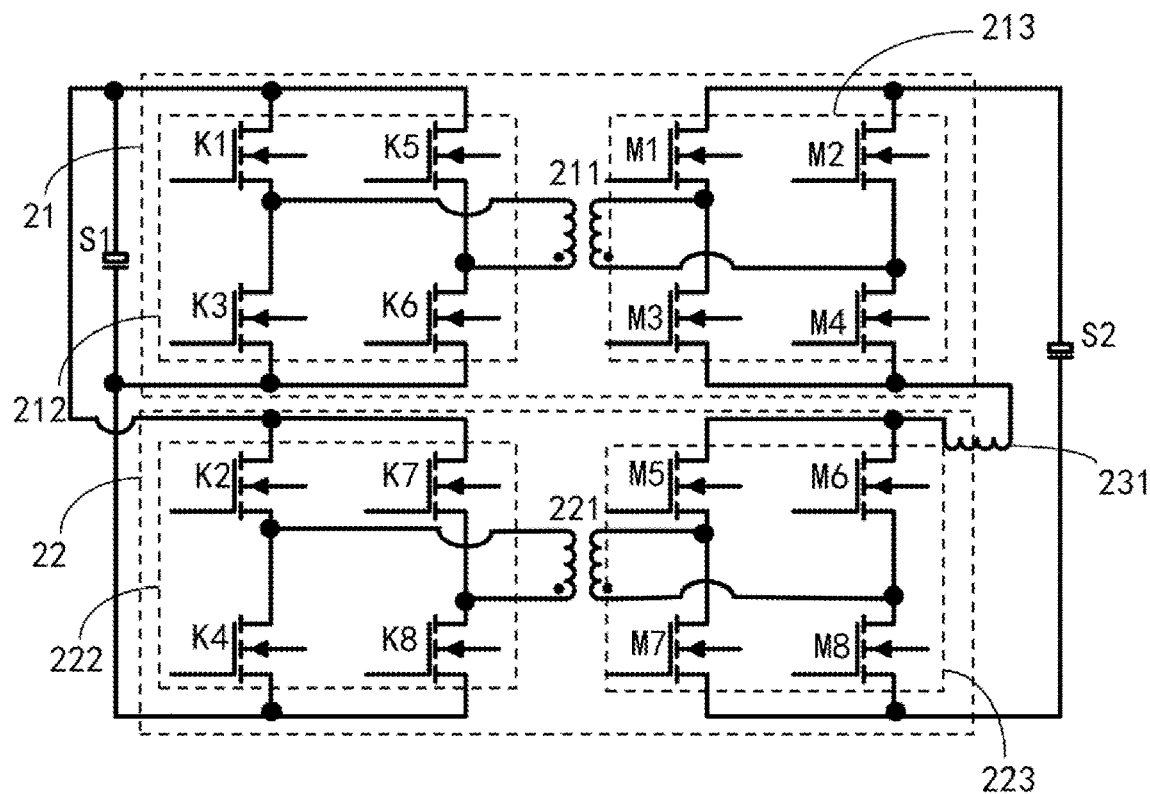
FIG. 8 is a schematic diagram of the structure of a fourth embodiment of the DC-to-DC converter circuit according to the present application.

Referring to FIG. 8, FIG. 8 is a schematic diagram of the fourth embodiment of the DC-to-DC converter circuit according to the present application. As shown in FIG. 8, each of the first branch 21 and the second branch 22 may have a full-bridge topology in this embodiment. The primary sides of the first branch 21 and the second branch 22 are coupled to the first power supply side S1. The secondary sides of the first branch 21 and the second branch 22 are coupled to the second power supply side S2. The secondary sides of the first branch 21 and the second branch 22 are connected in series via the first inductor 231.

The operation principle of the converter circuit shown in FIG. 8 is the same as those of the converter circuits in the foregoing embodiments. Therefore, detailed description for the operation principle will be omitted here.

A first embodiment of a circuit board layout structure for the DC-to-DC converter circuit according to the present application will be described below.

Figure 9:
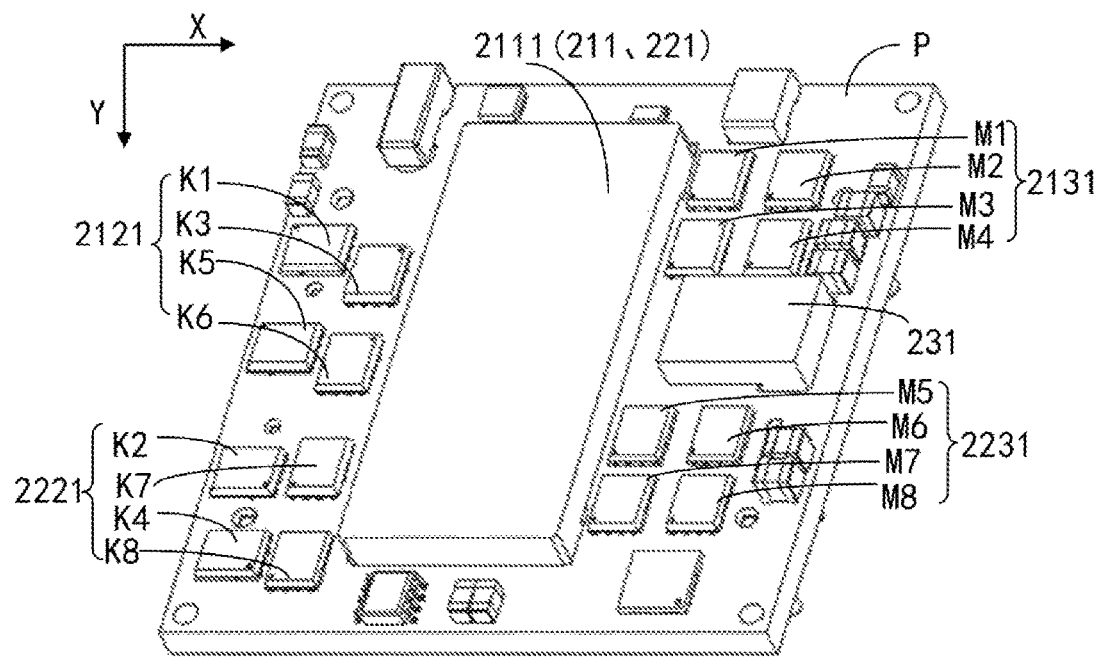
FIG. 9 is a schematic diagram of a first embodiment of a circuit board layout structure for the DC-to-DC converter circuit according to the present application.

As shown in FIG. 9, FIG. 9 is a schematic diagram of the first embodiment of the circuit board layout structure for the DC-to-DC converter circuit according to the present application. As shown in FIG. 9, the circuit board layout structure in the first embodiment according to the present application comprises a circuit board P, a transformer unit 2111, a first switching tube group 2121, a first rectifier tube group 2131, a second switching tube group 2221, a second rectifier tube group 2231, and a first inductor 231. The circuit board P has an X-axis direction, and a Y-axis direction perpendicular to the X-axis direction. The transformer unit 2111 is disposed on the circuit board P. The first switching tube group 2121 is disposed on the circuit board P, and at one side of the transformer unit 2111 in the X-axis direction. The first rectifier tube group 2131 is disposed on the circuit board P, and at the other side of the transformer unit 2111 in the X-axis direction. The second switching tube group 2221 is disposed on the board P, and at one side of the transformer unit 2111 in the X-axis direction. The second rectifier tube group 2231 is disposed on the circuit board P, and at the other side of the transformer unit 2111 in the X-axis direction. The first inductor 231 is disposed on the circuit board P, and between the first rectifier tube group 2131 and the second rectifier tube group 2231. Moreover, the first switching tube group 2121 and the second switching tube group 2221 are disposed at the same side of the transformer unit 2111 in the X-axis direction and arranged along the Y-axis direction. The first rectifier tube group 2131 and the second rectifier tube group 2231 are disposed at the same side of the transformer unit 2111 in the X-axis direction and arranged along the Y-axis direction. The first switching tube group 2121, the transformer unit 2111, and the first rectifier tube group 2131 constitute a first branch 21. The second switching tube group 2221, the transformer unit 2111, and the second rectifier tube group 2231 constitute a second branch 22. The specific structures of the first branch 21 and the second branch 22 and the connection relationship between the first branch 21 and the second branch 22 are the same as those shown in FIG. 3. Therefore, detailed description for the first branch 21 and the second branch 22 will be omitted here.

Further, the first switching tube group 2121 constitutes a first primary switching circuit 212 of the first branch 21. The first switching tube group 2121 includes a plurality of switching tubes K1, K3, K5, and K6 that are electrically connected to the transformer unit 2111. The first rectifier tube group 2131 constitutes a first secondary rectifier circuit 213 of the first branch 21. The first rectifier tube group 2131 includes a plurality of rectifier tubes M1, M2, M3, and M4 that are electrically connected to the transformer unit 2111. The second switching tube group 2221 constitutes a second primary switching circuit 222 of the second branch 22. The second switching tube group 2221 includes a plurality of switching tubes K2, K4, K7, and K8 that are electrically connected to the transformer unit 2111. The second rectifier tube group 2231 constitutes a second secondary rectifier circuit 223 of the second branch 22. The second rectifier tube group 2231 includes a plurality of rectifier tubes M5, M6, M7, and M8 that are electrically connected to the transformer unit 2111. With the above structure according to the present application, connection paths among the elements included in the first branch 21 and the second branch 22 are minimized, thereby reducing the power loss of the converter circuit and enhancing the efficiency of the converter circuit. Further, the power devices such as the first and second switching tube groups 2121 and 2221, and the first and second rectifier tube groups 2131 and 2231, are disposed at two sides of the transformer unit 2111 separately. Additionally, the first rectifier tube group 2131 and the second rectifier tube group 2231 are disposed symmetrically with respect to the first inductor 231. Thus, the above structure according to the present application may improve the symmetry of the entire layout structure of the circuit board for the DC-to-DC converter circuit, improve space utilization, facilitate cold air convection, facilitate heat dissipation, and increase power density of the products.

In this embodiment, preferably, the first transformer 211 and the second transformer 221 may be integrated into one transformer unit 2111. However, the present application is not limited thereto.

A second embodiment of a circuit board layout structure for the DC-to-DC converter circuit according to the present application will be described below.

Figure 10:
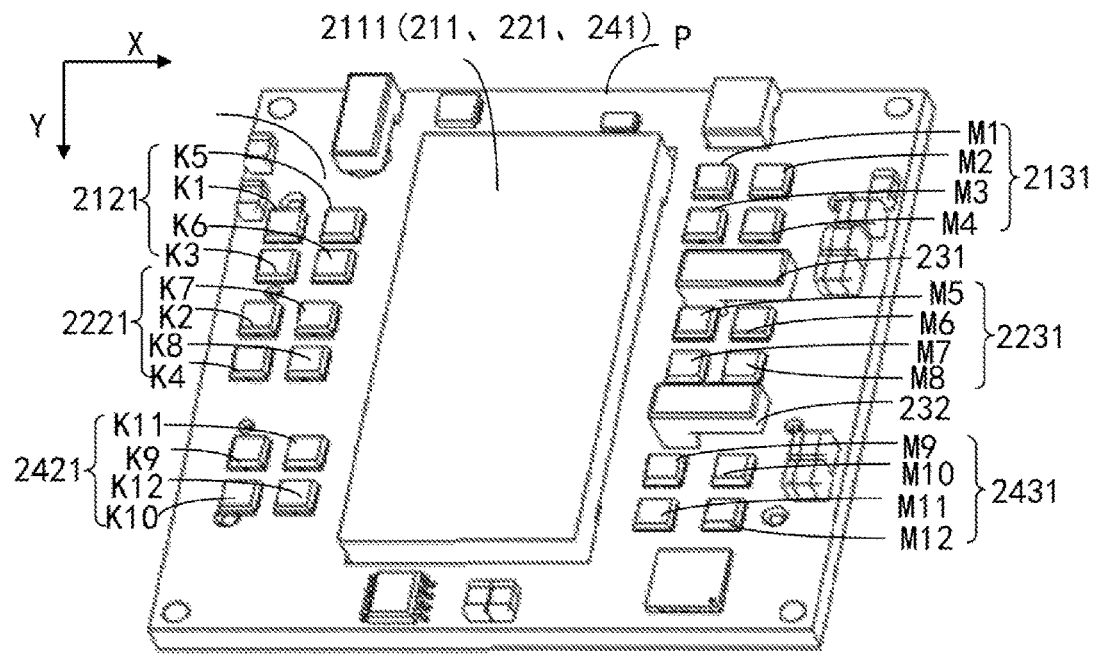
FIG. 10 is a schematic diagram of a second embodiment of the circuit board layout structure for the DC-to-DC converter circuit according to the present application.

Referring to FIG. 10, FIG. 10 is a schematic diagram of the second embodiment of the circuit board layout structure for the DC-to-DC converter circuit according to the present application. As shown in FIG. 10, in addition to the circuit board P, the transformer unit 2111, the first switching tube group 2121, the first rectifier tube group 2131, the second switching tube group 2221, the second rectifier tube group 2231, and the first inductor 231 shown in FIG. 9, the circuit board layout structure in the second embodiment according to the present application may further comprise a third switching tube group 2421, a third rectifier tube group 2431, and a second inductor 232. The third switching tube group 2421 is disposed on the circuit board P, and at one side of the transformer unit 2111 in the X-axis direction. The third rectifier tube group 2431 is disposed on the circuit board P, and at the other side of the transformer unit 2111 in the X-axis direction. The second inductor 232 is disposed on the circuit board P, and between the second rectifier tube group 2231 and the third rectifier tube group 2431. Moreover, the third switching tube group 2421, the first switching tube group 2121, and the second switching tube group 2221 are disposed at the same side of the transformer unit 2111 in the Y-axis direction and arranged along the X-axis direction. The third rectifier tube group 2431, the first rectifier tube group 2131, and the second rectifier tube group 2231 are disposed at the same side of the transformer unit 2111 in the X-axis direction and arranged along the Y-axis direction. The third switching tube group 2421, the transformer unit 2111, and the third rectifier tube group 2431 constitute a third branch 24. The specific structures of the first branch 21, the second branch 22, and the third branch 24 as well as the connection relationship among the first branch 21, the second branch 22, and the third branch 24 are the same as those shown in FIG. 6. Therefore, detailed description for the first branch 21, the second branch 22, and the third branch 24 will be omitted here.

Further, the third switching tube group 2421 constitutes a third primary switching circuit 242 of the third branch 24. The third switching tube group 2421 includes a plurality of switching tubes K9, K10, K11, and K12 that are electrically connected to the transformer unit 2111. The third rectifier tube group 2431 constitutes a third secondary rectifier circuit 243 of the third branch 24. The third rectifier tube group 2431 includes a plurality of rectifier tubes M9, M10, M11, and M12 that are electrically connected to the transformer unit 2111. With the above structure according to the present application, connection paths among the elements included in the first branch 21, the second branch 22, and the third branch 24 may be minimized, thereby reducing the power loss of the converter circuit and enhancing the efficiency of the converter circuit. Further, the above structure according to the present application may improve the symmetry of the entire layout structure of the circuit board for the DC-to-DC converter circuit, improve space utilization, facilitate cold air convection, facilitate heat dissipation, and increase power density of the products.

In this embodiment, preferably, the first transformer 211, the second transformer 221, and the third transformer 241 may be integrated into one transformer unit 2111. However, the present application is not limited thereto.

Note that the number of the third branch in the present invention is not specifically limited in the present invention. In another embodiment according to the present application, the converter circuit may further comprise at least one third branch 24 and at least one third inductor. Each of the third inductor may be disposed between two adjacent third secondary rectifier circuits 243 along the Y-axis direction.

A third embodiment of a circuit board layout structure for the DC-to-DC converter circuit according to the present application will be described below.

Figure 11:
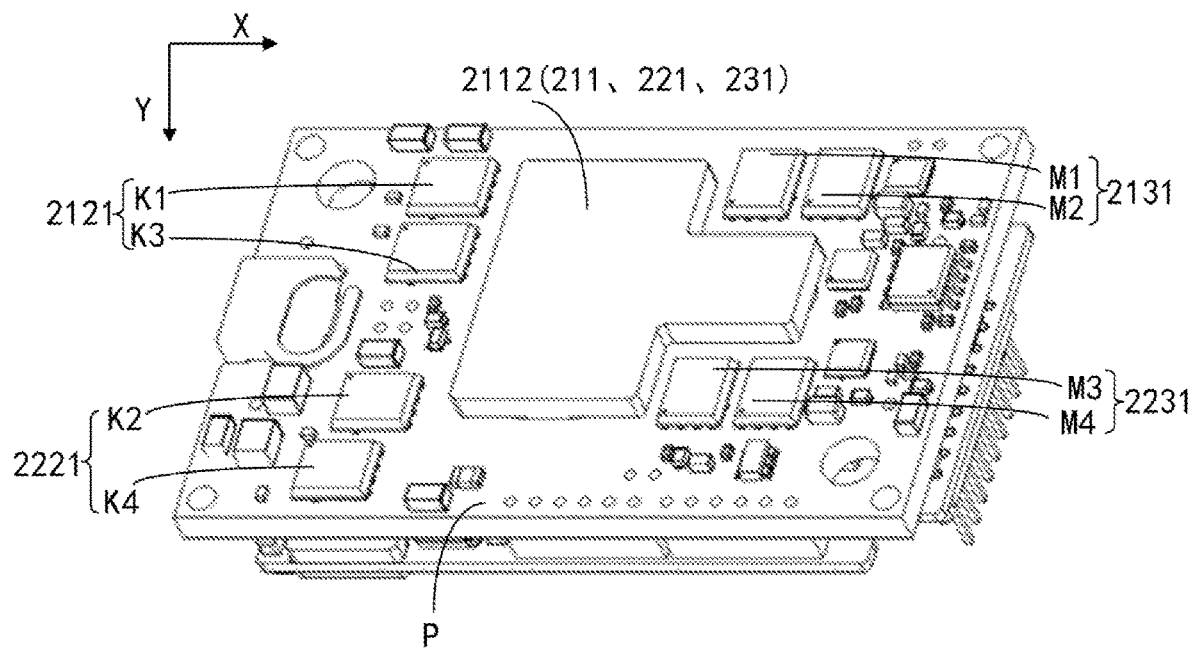
FIG. 11 is a schematic diagram of a third embodiment of the circuit board layout structure for the DC-to-DC converter according to the present application.

Referring to FIG. 11, FIG. 11 is a schematic diagram of the third embodiment of the circuit board layout structure for the DC-to-DC converter circuit according to the present application. The circuit board layout structure shown in FIG. 11 is substantially the same as that shown in FIG. 9. Therefore, detailed description for the same elements will be omitted here. The circuit board layout structure shown in FIG. 11 differs from that shown in FIG. 9 in that the inductor 231, the first transformer 211, and the second transformer 221 are integrated into a magnetic element 2112, so as to further increase space utilization and power density.

Note that, in another embodiment according to the present application, the first transformer 211, the second transformer 221, at least one third transformer 241 may be integrated with the first inductor 231, the second inductor 232, and the at least one third inductor so as to form a magnetic element.

In summary, according to the present application, an inductor may be disposed between two secondary rectifier circuits, so as to decrease the radiation interference, to reduce the common-mode currents, and to improve the electromagnetic interference (EMI) performance. Moreover, the circuit structure according to the present application may improve the symmetry of the entire layout structure of the circuit board for the DC-to-DC converter circuit, improve space utilization, facilitate cold air convection, facilitate heat dissipation, and increase power density of the products. When appropriate, the transformer(s) and inductor(s) may be integrated so as to further improve the space utilization and to increase the power density.

Note that the above embodiments are only used to illustrate the present application but not to limit the technical solution described in the present application. Moreover, although the present application is described in detail with reference to the above embodiments in this specification, the ordinary persons skilled in the art should understand that modifications or equivalent substitutions may also be made to the present application. Therefore, all the technical solutions not departing from the spirit and scope of the present application and the improvements thereof should be covered by the protection scope of the appended claims according to the present application.

What is claimed is:

1. A DC-to-DC converter circuit electrically connected between a first power supply side and a second power supply side, comprising:
    a first branch with a primary side coupled to the first power supply side and a secondary side coupled to the second power supply side;
    a second branch with a primary side coupled to the first power supply side and a secondary side coupled to the second power supply side; and
    a first inductor,
    wherein, the secondary sides of the first branch and the second branch are connected in series via the first inductor,
    wherein, the primary side of the first branch and the primary side of the second branch are connected in parallel,
    wherein primary switching circuits in the first branch and the second branch have a duty ratio which is set to enable the first branch and the second branch to output an output current of zero-ripple, and the duty ratio is any value in a range of 20% to 30%.

2. The DC-to-DC converter circuit according to claim 1, wherein
    the first branch comprises:
    a first transformer, comprising a primary winding and a secondary winding;
    a first primary switching circuit with one end electrically connected to the primary winding of the first transformer and the other end electrically connected to the first power supply side; and
    a first secondary rectifier circuit with one end electrically connected to the secondary winding of the first transformer and the other end electrically connected to the second power supply side and one end of the first inductor, and
    the second branch comprises:
    a second transformer, comprising a primary winding and a secondary winding;
    a second primary switching circuit with one end electrically connected to the primary winding of the second transformer and the other end electrically connected to the first power supply side; and
    a second secondary rectifier circuit with one end electrically connected to the secondary winding of the second transformer and the other end electrically connected to the second power supply side and the other end of the first inductor.

3. The DC-to-DC converter circuit according to claim 2, wherein a first connection point and a second connection point are formed between the first secondary rectifier circuit and the secondary winding of the first transformer, and a third connection point and a fourth connection point are formed between the second secondary rectifier circuit and the secondary winding of the second transformer,
    wherein, when the converter circuit operates, there is an AC impedance of the first inductor between the first and second connection point and the third and fourth connection points, so that the jump voltages at the first connection point and the second connection point are no longer superimposed on the jump voltages at the third connection point and the fourth connection point.

4. The DC-to-DC converter circuit according to claim 2, wherein a first connection point and a second connection point are formed between the first secondary rectifier circuit and the secondary winding of the first transformer, and
wherein when the converter circuit operates, jump frequencies of voltages at the first connection point and the second connection point are same as the switching frequencies of the first primary switching circuit, and the switching frequencies of the first primary switching circuit and the second primary switching circuit are the same.

5. The DC-to-DC converter circuit according to claim 2, further comprising:
a second inductor; and
a third branch, including:
a third transformer, including a primary winding and a secondary winding;
a third primary switching circuit with one end electrically connected to the primary winding of the third transformer and the other end electrically connected to the first power supply side; and
a third secondary rectifier circuit with one end electrically connected to the secondary winding of the third transformer and the other end electrically connected to the second power supply side and one end of the second inductor, the other end of the second inductor being electrically connected to the second secondary rectifier circuit.

6. The DC-to-DC converter circuit according to claim 5, further comprising a plurality of the third branches and at least one third inductor,
wherein, every two adjacent secondary rectifier circuits are connected in series via the third inductor.

7. The DC-to-DC converter circuit according to claim 6, wherein, the phase difference Θ between the driving signals for switching tubes at the same position in the first primary switching circuit, the second primary switching circuit and the third primary switching circuit is Θ=180°/S, where S is the number of the branches.

8. The DC-to-DC converter circuit according to claim 1, wherein the first branch and the second branch are of any one of a half-bridge topology, a full-bridge topology, and a forward topology.

9. The DC-to-DC converter circuit according to claim 5, wherein the first branch, the second branch, and the third branch are of any one of a half-bridge topology, a full-bridge topology, and a forward topology.

10. A circuit board layout structure for a DC-to-DC converter circuit, the DC-to-DC converter circuit electrically connected between a first power supply side and a second power supply side, and including a first branch with a primary side coupled to the first power supply side and a secondary side coupled to the second power supply side, a second branch with a primary side coupled to the first power supply side and a secondary side coupled to the second power supply side, and a first inductor, the secondary sides of the first branch and the second branch being connected in series via the first inductor,
the circuit board layout structure comprising:
a circuit board, having an X-axis direction, and a Y-axis direction perpendicular to the X-axis direction;
a transformer unit, disposed on the circuit board;
a first switching tube group, disposed on the circuit board, and arranged at one side of the transformer unit in the X-axis direction;
a first rectifier tube group, disposed on the circuit board, and arranged at the other side of the transformer unit in the X-axis direction;
a second switching tube group, disposed on the circuit board, and arranged at one side of the transformer unit in the X-axis direction;
a second rectifier tube group, disposed on the circuit board, and arranged at the other side of the transformer unit in the X-axis direction; and
a first inductor, disposed on the circuit board, and arranged between the first rectifier tube group and the second rectifier tube group,
wherein the first switching tube group and the second switching tube group are disposed at the same side of the transformer unit in the X-axis direction and arranged along the Y-axis direction, and the first rectifier tube group and the second rectifier tube group are disposed at the same side of the transformer unit in the X-axis direction and arranged along the Y-axis direction,
wherein, the primary side of the first branch and the primary side of the second branch are connected in parallel,
wherein primary switching circuits in the first branch and the second branch have a duty ratio which is set to enable the first branch and the second branch to output an output current of zero-ripple, and the duty ratio is any value in a range of 20% to 30%.

11. The circuit board layout structure according to claim 10, wherein the first rectifier tube group and the second rectifier tube group are disposed symmetrically with respect to the first inductor.

12. The circuit board layout structure according to claim 11, further comprising:
a third switching tube group, disposed on the circuit board, and arranged at one side of the transformer unit in the X-axis direction;
a third rectifier tube group, disposed on the circuit board, and arranged at the other side of the transformer unit in the X-axis direction; and
a second inductor, disposed on the circuit board, and arranged between the second rectifier tube group and the third rectifier tube group,
wherein the third switching tube group, the first switching tube group, and the second switching tube group are disposed at the same side of the transformer unit in the X-axis direction and arranged along the Y-axis direction, and the third rectifier tube group, the first rectifier tube group, and the second rectifier tube group are disposed at the same side of the transformer unit in the X-axis direction and arranged along the Y-axis direction.

13. The circuit board layout structure according to claim 12, further comprising:
a plurality of the third switching tube group, disposed on the circuit board, and arranged at one side of the transformer unit in the X-axis direction;
a plurality of the third rectifier tube group, disposed on the circuit board, and arranged at the other side of the transformer unit in the X-axis direction; and
at least one third inductor, each being disposed between every two adjacent third rectifier tube groups.

14. The circuit board layout structure according to claim 10, wherein the transformer unit and the first inductor are integrated into a magnetic element.

15. The circuit board layout structure according to claim 12, wherein the transformer unit, the first inductor, and the second inductor are integrated into a magnetic element.

16. The circuit board layout structure according to claim 13, wherein the transformer unit, the first instructor, the second inductor, and the at least one third inductor are integrated into a magnetic element.

* * * * *